(12) United States Patent
Robinson

(10) Patent No.: US 6,822,595 B1
(45) Date of Patent: Nov. 23, 2004

(54) EXTENDED RANGE DIGITAL-TO-ANALOG CONVERSION

(75) Inventor: Ian Robinson, Venice, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/463,950

(22) Filed: Jun. 18, 2003

(51) Int. Cl.[7] .............................................. H03M 1/66
(52) U.S. Cl. ...................................... 341/144; 341/143
(58) Field of Search ................................ 341/143, 144, 341/145, 141, 118, 159, 120, 126

(56) References Cited

U.S. PATENT DOCUMENTS

| | | | | |
|---|---|---|---|---|
| 5,005,082 A | * | 4/1991 | Zdepski et al. | 348/613 |
| 6,154,161 A | * | 11/2000 | Leme et al. | 341/143 |
| 6,177,893 B1 | * | 1/2001 | Velazquez et al. | 341/118 |
| 6,201,486 B1 | * | 3/2001 | Chan et al. | 341/61 |
| 6,353,404 B1 | * | 3/2002 | Kuroiwa | 341/144 |
| 6,356,224 B1 | * | 3/2002 | Wohlfarth | 341/147 |
| 6,369,735 B1 | | 4/2002 | Yang | |
| 6,518,905 B2 | * | 2/2003 | Siferd | 341/143 |
| 2001/0052864 A1 | * | 12/2001 | Shimizu et al. | 341/141 |

* cited by examiner

*Primary Examiner*—Brian Young
*Assistant Examiner*—John B Nguyen
(74) *Attorney, Agent, or Firm*—Tarolli, Sundheim, Covell & Tummino L.L.P.

(57) ABSTRACT

A conversion system converts an input signal from a digital signal to an analog signal over an extended dynamic range. The system includes a DAC system and a mode selector. The mode selector selects a mode of operation for the digital-to-analog converter system from a plurality of modes. The mode selector selects a mode according to a characteristic of the input signal. Each of the modes is associated with an instantaneous dynamic range and quantization noise level of the DAC system. The ensemble of modes provides an improvement in total or effective dynamic range compared to any DAC component within the DAC system.

21 Claims, 6 Drawing Sheets

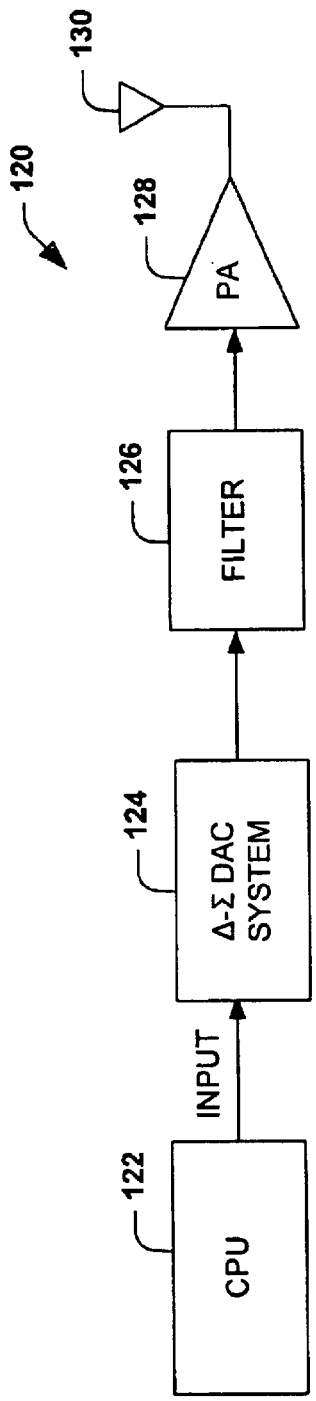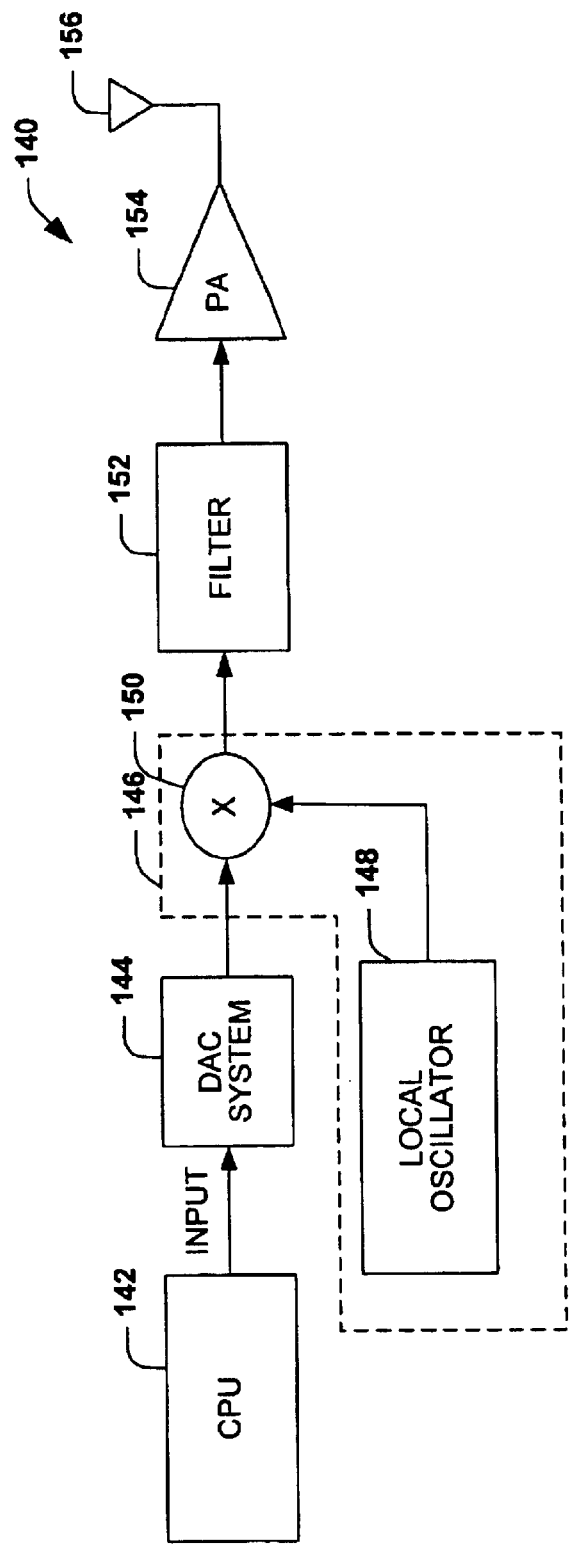

EXTENDED RANGE DIGITAL-TO-ANALOG CONVERSION

TECHNICAL FIELD

The present invention relates generally to electronic devices, and more particularly to digital-to-analog conversion.

BACKGROUND OF THE INVENTION

Modern transmitters for applications such as cellular, personal, and satellite communications employ digital modulation techniques such as quadrature phase-shift keying (QPSK) in combination with code division multiple access (CDMA) communication. Shaping of the data pulses mitigates out-of-band emissions from occurring into adjacent spectral channels but produces time-varying envelopes. Transmission of multiple carriers simultaneously also results in time-varying envelopes. In many cases the time varying envelopes exhibit large but infrequent peaks. These peaks require digital-to-analog converters (DACs) within the transmitter to have dynamic ranges that encompass the peak values to avoid clipping the signal which would introduce significant distortion of the signal. This signal distortion can lead to both errors in the wanted signals and increased out-of-band emissions.

Dynamic range refers to the ratio between the largest signal and the noise level of the DAC. Noise sources include electronic noise, quantization noise, and spurious signals resulting from non-linearities in the DAC. Dynamic range can be measured in decibels or effective bits.

A DAC provides outputs signals over a specific voltage range. To operate over a wide range either the voltage step size between outputs, and the corresponding quantization noise, is increased or dynamic range must be increased. For conventional multi-bit DACs the quantization noise is relatively constant as a function of frequency and extends from DC to one half the conversion rate. Delta-sigma DACs have very low quantization noise in selected passbands and high noise levels elsewhere. Quantization noise that is not filtered in the signal chain is amplified and transmitted contributing to received bit-errors and causing interference in adjacent spectral regions.

Recently, a new CDMA standard has evolved referred as WCDMA (wide code division multiple access) that employs multiple frequency carriers. WCDMA has signal amplitudes that vary substantially over time producing large peak-to-average ratios. Other standards that include multi-carriers or similar noise shaped signatures (e.g., Orthogonal frequency-division multiplexing (OFDM), Global System for Mobile Communication (GSM)) have similar large peak-to-average ratios. These standards are governed by increasingly strict international standards and national regulations mandating low out-of-band emissions. Therefore, DACs capable of converting signals with high peak-to-average rations and/or with large dynamic range are required in applications making use of these standards in light of their large associated peak to average signal ratio.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to a system for converting a digital input signal into an analog output signal. The system is operative to alter the instantaneous dynamic range of a system of one or more DAC devices in response to a characteristic of the input signal to mitigate the quantization noise produced in the conversion.

In one aspect of the invention, a conversion system converts an input signal from a digital signal to an analog signal over an extended dynamic range. The system includes a DAC system and a mode selector. The mode selector selects a mode of operation for the digital-to-analog converter system from a plurality of modes. The mode selector selects a mode according to a characteristic of the input signal. Each of the modes is associated with an instantaneous dynamic range and a quantization noise level of the DAC system. In a further aspect of the invention, the DAC system can include one or more delta-sigma modulators to convert the digital input signal to a digital signal having a higher frequency prior to analog conversion.

In another aspect of the invention, the system for converting a digital input signal into an analog signal can include a DAC system comprising a plurality of DAC devices. Each of the DAC devices has an associated dynamic range and quantization noise level. The mode selector includes a switch that selects the output of one of the plurality of DAC devices based upon a characteristic of the input signal. In a further aspect of the invention, the signal characteristic can be the amplitude of the input signal.

In yet another aspect of the present invention, the system for converting a digital input into an analog signal can include a DAC system comprising a DAC device with a variable dynamic range. The DAC device includes a voltage supply input that allows the input voltage range of the DAC device to be altered. The mode selector alters the dynamic range of the DAC device according to a characteristic of the input signal.

In still another aspect of the invention, a system for converting a digital input into an analog signal can include a DAC system comprising a DAC device, a scaling device, and an extra gain switch. A mode control determines an appropriate scaling factor from a set of at least one discrete scaling factor according to a characteristic of the signal. The selected scaling factor can be provided to the scaling device and according to a control signal from the mode control. A corresponding gain factor can be provided to the extra gain switch. The input signal can be scaled by the scaling device before it is input into the DAC device. The output of the DAC device can be amplified by the selected gain factor.

In a still further aspect of the invention, a system for converting a digital signal to an analog signal can include a mode control/select and a DAC system. The mode control/select splits the input signal into a phase modulated component and an amplitude modulated component when a characteristic of the input signal meets a predetermined threshold. A first DAC device processes the amplitude modulated component and a second DAC device processes the phase modulated component. The output of the second DAC device is amplified by an amplifier receiving the output of the first DAC device as a supply voltage input. Where the threshold is not met, the entire input signal is provided to the second DAC device and a constant voltage supply signal is applied to the amplifier.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 8 is a block diagram depicting part of a communications system incorporating a conversion system in accordance with an aspect of the present invention.

FIG. 9 is a block diagram depicting part of a communications system incorporating a conversion system in accordance with another aspect of the present invention.

DETAILED DESCRIPTION OF INVENTION

The present invention relates to a system for converting a digital signal to an analog signal. The system selects a mode of operation based upon a characteristic, such as amplitude or frequency, of the input signal. Each mode of operation corresponds to an instantaneous dynamic range and corresponding quantization noise level of a digital-to-analog converter system. The ensemble of modes provides an increased dynamic range and/or a reduced quantization noise level compared to a single mode. The input signal can thus be converted at a dynamic range matching its instantaneous characteristics. This flexible dynamic range reduces the average quantization error of the output signal. This is particularly useful in communications application, where excessive quantization error can result in out-of-band emissions and other signal distortion. Thus, the digital-to-analog conversion system of the present invention is well-suited for use within transmitters, including mobile transmitters as well as those within a base station of a communications network. The disclosed system, however, will be useful in any application where noise reduction over a large dynamic range is desired and is not limited to use within communications equipment.

The present invention overcomes one or more known obstacles in digital-to-analog converter design. For example, the dynamic range of a prior art DAC of a given resolution (e.g., 8-bits), can be increased only at the cost of an increase in the amount of circuitry and or the conversion speed. Both changes normally increase power consumption and incur additional component cost. The maximum output signal voltage can be increased, but without additional dynamic range, the quantization noise level increases proportionally. While increasing the resolution of the DAC can counteract this noise increase, there are practical limits to the bits of resolution of a conventional DAC. The present invention allows the instantaneous dynamic range of a DAC of a given resolution to be extended without substantial increase in quantization noise.

Figure 1:
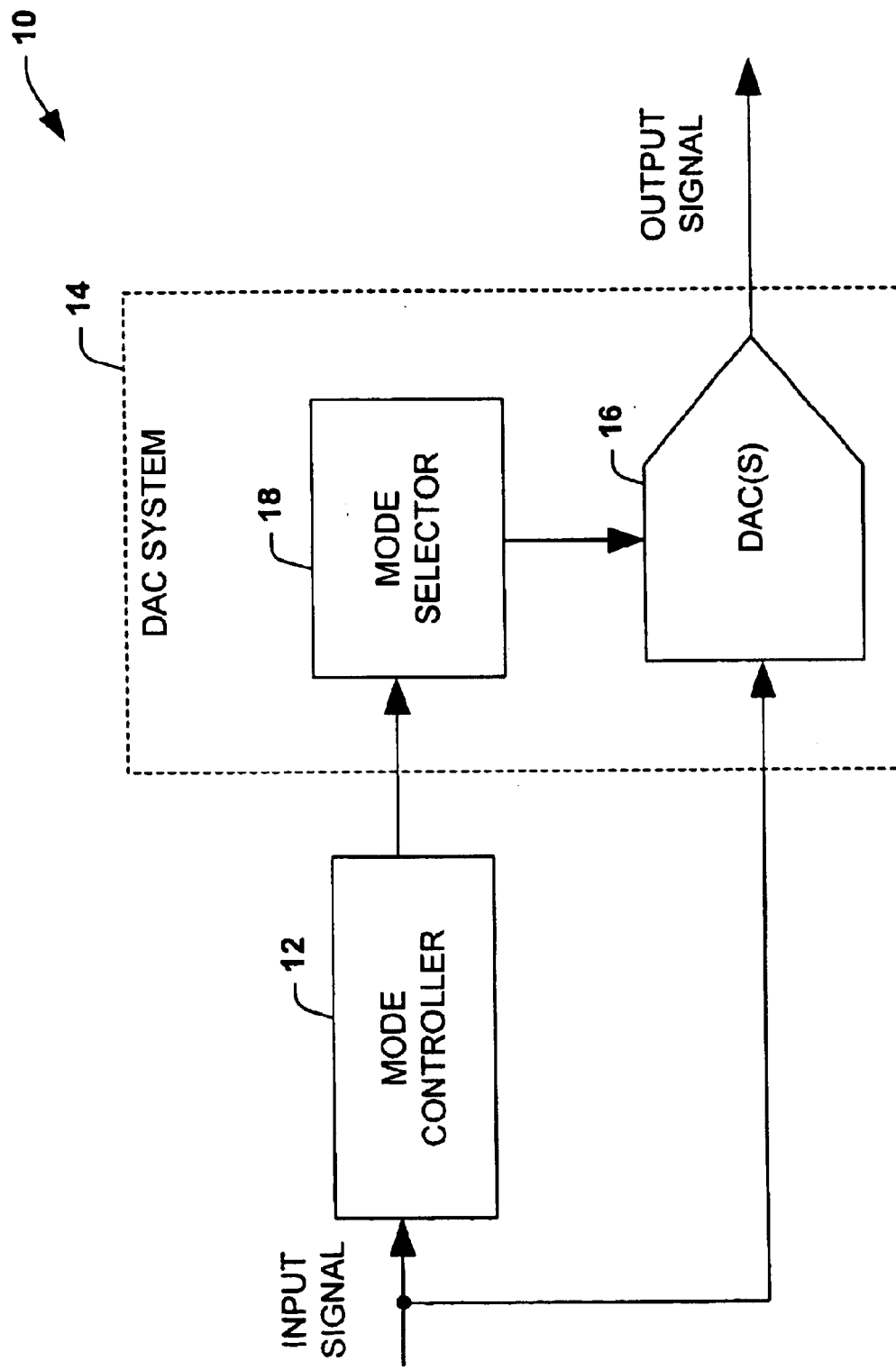
FIG. 1 illustrates a schematic block diagram of a signal conversion system in accordance with an aspect of the present invention.

FIG. 1 illustrates a system 10 that converts a digital input signal into an analog output signal over an extended dynamic range, in accordance with an aspect of the present invention. The system 10 receives a digital input signal at a mode control 12. The mode control 12 evaluates a characteristic of the input signal to determine one of a plurality of modes of operation for a DAC system 14 that includes a DAC arrangement 16 comprised of one or more DAC devices. The mode control 12 can comprise a programmable logic device, a digital signal processor (DSP) or any combination of digital hardware and/or software components suitable to carry out this evaluation and other necessary functions. Each mode of the DAC system 14 has an associated instantaneous dynamic range, quantization noise, and output voltage level. The evaluated characteristic of the input signal can include the frequency, phase, amplitude, or any other readily quantifiable characteristic of the input signal. This characteristic can be compared to one or more threshold values in selecting a mode for the DAC system 14. In the alternative, the input signal can comprise a tracking signal, indicating a proper mode for the DAC system 14, and this tracking signal can serve as the evaluated characteristic. Once the mode control 12 has determined a mode for the DAC system 14, it outputs a control signal to a mode selector 18 within the DAC system 14.

The mode selector 18 selects a mode for the DAC system 14 based upon the input of the mode control 12. The mode selector 18 modifies the operation of the DAC system 14 to cause the DAC system 14 to operate with an instantaneous dynamic range and output signal level associated with the mode determined by the mode control 12. The mode selector 18 can modify the dynamic range associated with the DAC system 14 in a number of ways. It is to be to be appreciated that the mode selector 18 and the mode control 12 can be combined into a single component performing the function of both components.

The DAC arrangement 16 converts the input signal from a digital signal to an analog signal at a dynamic range determined by the mode selected by the mode selector 18. The composition of the DAC arrangement 16 may vary. For example, the DAC arrangement 16 may contain any number of DAC devices having a variety of dynamic ranges and resolutions. The specific operation of the DAC system 14 is determined by the mode selector 18, which can be interspersed throughout the DAC arrangement 16. The mode selector 18 can include switches, amplifiers, scaling devices, additional DAC components, and other digital or analog components necessary to operate the DAC system 14 at the instantaneous dynamic ranges associated with the ensemble of modes.

The one or more DAC devices within the DAC arrangement 16 can work in conjunction with delta-sigma modulators. Delta-sigma modulation is a technique used to generate a coarse estimate of a signal using a small number of quantization levels and a high sampling rate. The limited number of discrete signal levels introduces "quantization" noise into the system. The effect of oversampling and the use of an integrator feedback-loop in delta-sigma modulation are effective in shifting noise, including quantization noise, to out-of-band frequencies. The noise shifting properties enables efficient use of subsequent filtering stages to remove noise and produce a more precise representation of the input.

As discussed above, successful digital-to-analog conversion requires a dynamic range that encompasses the entire range of signals received by the system. This comes at a price of increased bits of resolution, however. For example, an eight-bit DAC can convert two hundred fifty-six discrete voltage levels, referred to as quantization levels. If the desired analog signal has a value that does not precisely match one of these levels, a degree of error, called quantization error, will be produced by the conversion. The resolution of a DAC is proportional to signal difference between adjacent quantization levels. To convert digital signals of greater range (more bits) necessitates a DAC of greater resolution to maintain the same level of quantization error. This increases the complexity and the expense of the system.

Figure 2:
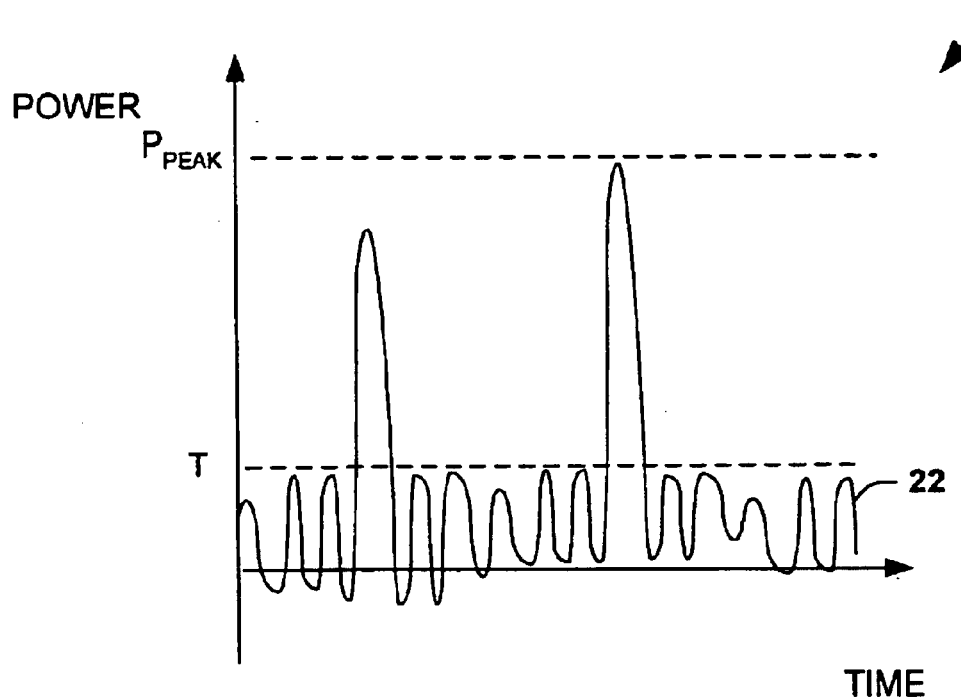
FIG. 2 illustrates an exemplary input signal having a high peak-to-average signal ratio
Figure 3:
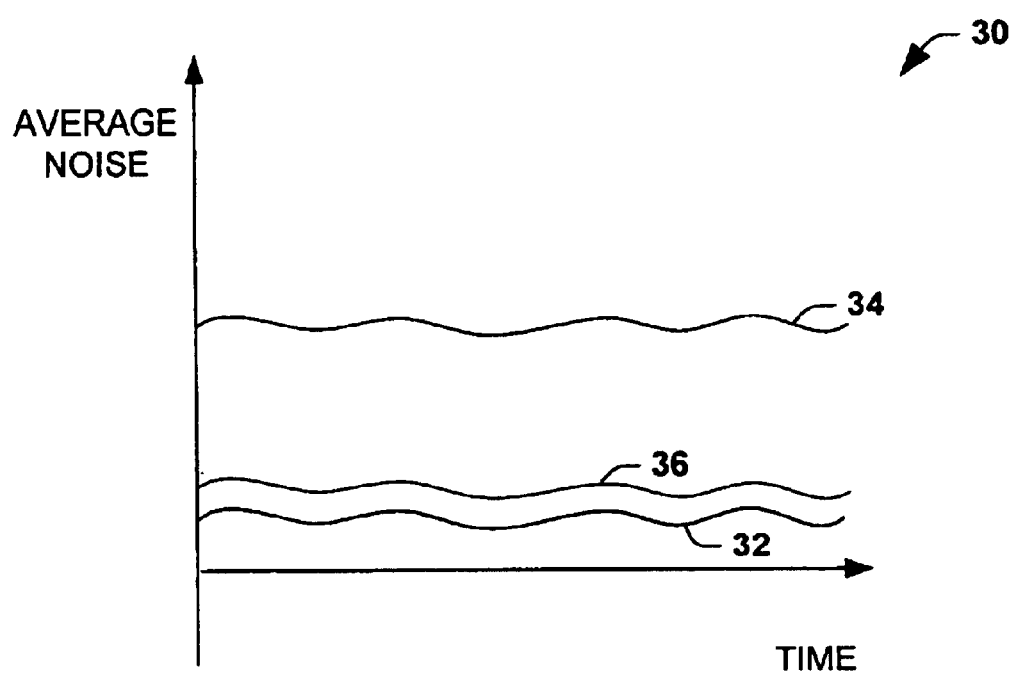
FIG. 3 illustrates graph of the average noise overtime for various modes of a DAC system in accordance with an aspect of the present invention.

FIGS. 2 and 3 illustrate signals associated with the operation of an exemplary DAC system in accordance with an aspect of the present invention. The exemplary system will be described as having two modes of operation, a High Signal mode and a Low Signal mode. Further, the example embodiment evaluates the signal amplitude against a threshold value, T, to determine an appropriate mode for the system. It will be appreciated that the following is merely exemplary, and that a DAC system according to the present invention can have more than two modes, multiple thresholds, and evaluated characteristics other than the amplitude.

FIG. 2 illustrates a graph 20 of the amplitude of an input signal 22 over a period of time. The signal represents an input signal having a high peak-to-average signal ratio similar to that of several common carrier signals. A peak power, $P_{PEAK}$, is marked on the graph as the maximum signal amplitude attained during normal operation. A threshold value, T, is set to encompass a majority of the signal peaks received during operation. In practice, this threshold can be set such that it is exceeded by the input signal amplitude roughly ten percent of the time during operation. This value is arbitrary, however, and will vary with the application and the configuration of the DAC system. It will be appreciated that the occurrence of peaks within this example input is exaggerated; in a typical signal, peaks approaching the signal maximum tend to be rare.

FIG. 3 illustrates a graph 30 of the average quantization noise level of an extended range DAC according to an aspect of the invention. The illustrated averages reflect a DAC having two modes of operation, a Low Signal mode, encompassing a range from a zero signal amplitude to the threshold value T, and a High Signal mode that includes the entire range of signals, from zero to the maximum peak level, $P_{PEAK}$.

When the DAC system is operating in the Low Signal mode, the quantization levels provided by the resolution of a DAC device need only resolve the truncated dynamic range of the device. The quantization noise of the system will be much smaller in Low Signal mode than in High Signal mode. In an exemplary implementation, the quantization noise power was found to be approximately 6 dB below maximum signal output power for every DAC bit during Low Signal operation. Operating over the low end of the signal range only, the quantization noise is reduced proportionally to T. When the DAC system is operating at a high dynamic range, each quantization levels of the DAC device represents a greater range of signal amplitude, and exhibits proportionally higher quantization noise. It will be appreciated that the quantization noise 34 created during this High Signal mode will be considerably larger than the noise produced during operation at a Low Signal mode. The total quantization noise is the weighted average of the noise produced in both modes. If the signal statistics are such that signals exceed T only 1°/ of the time then the impact of the larger quantization noise in Large Signal mode will have a small effect.

In accordance with the present invention, the DAC system will generally operate at a Low Signal range. The system switches to a High Signal mode only when the amplitude of the input signal exceeds a threshold value. As discussed above, the threshold value is set such that operation at a high dynamic range is necessary only a minority of the time.

In the example, two DACs with the same number of bits or quantization levels are employed to represent the High Signal range and the Low Signal range. It is to be appreciated that the two DACs could have different characteristics. It will also be appreciated that systems utilizing one DAC or more than two DACs can be employed to a similar advantage within the scope of the present invention. Compared to a conventional single mode system, the system of the present invention provides output signals over a much larger range with only a small degradation in quantization noise. The dynamic range of a DAC utilizing an ensemble of modes is much greater than the dynamic range of a single mode DAC.

FIGS. 4–7 each illustrate an exemplary implementation of the present invention. These exemplary embodiments are not intended to be exhaustive, and the invention encompasses equivalents to the recited embodiments that are not herein described. To simplify the explanation of these examples, each implementation uses the amplitude of the input signal as the evaluated characteristic of the input signal. These examples are purely illustrative and should not be read to limit the appended claims. For example, in practice, any quantifiable characteristic of the input signal may be evaluated.

Figure 4:
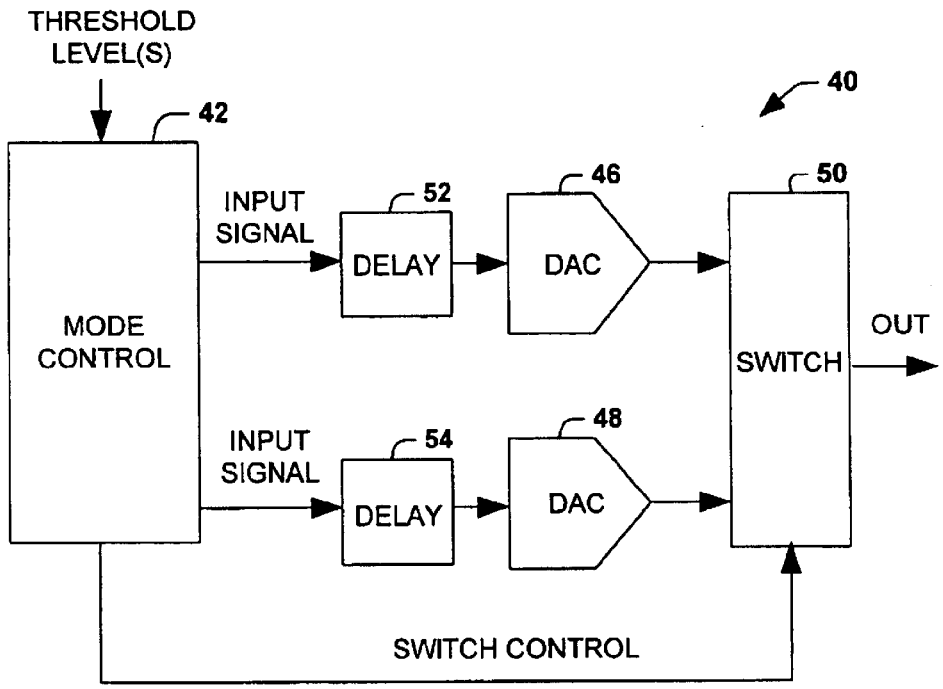
FIG. 4 illustrates a schematic block diagram of an exemplary signal conversion system in accordance with an aspect of the present invention.

In accordance with an aspect of the present invention, FIG. 4 illustrates an exemplary system 40 that converts a digital input signal into an analog output signal over an extended dynamic range. An input signal is received at a mode control 42. The mode control 42 evaluates the signal to determine if the amplitude of the signal exceeds one or more threshold values. The input signal is also provided in parallel to a plurality of DAC devices (e.g., 46 and 48), each having a different dynamic range. The mode control 42 outputs a control signal (SWITCH CONTROL) to a switch 50 based upon the results of the evaluation of the input signal. The switch 50 selects the output of one of the plurality of DAC devices based upon the control signal.

Each of the plurality of DAC devices has a different output signal range. For example, a first DAC device 46 can be an eight bit DAC having a dynamic range spanning a signal amplitude range from zero to a signal amplitude of 3.6 decibels over an average signal. A second DAC device 48 can be an eight-bit DAC having a dynamic range spanning a signal amplitude range from zero to fifteen decibels over the average signal. In the example, the first DAC device 46 has a significantly smaller quantization levels than the second DAC device 48 due to its output signal range. The mode control 42 would compare the signal amplitude to a threshold value roughly equal to the extreme upper limit of the dynamic range of the first DAC device 46. In a system having more than two DAC devices, multiple thresholds can be used, each representing the upper limit of the dynamic range of one of the DAC device's.

If the mode control 42 determines that the input signal has an amplitude less than the threshold value, a control signal is sent to the switch 50 to select the output of the first DAC device 46. The input signal sent to the DAC devices (46 and 48) will be delayed at a delay device (e.g., 52 and 54) on each path to synchronize the operation switch 50 with the conversion of the input signal. The first DAC device 46 will thus provide the output analog signal whenever the amplitude of the input signal falls within the dynamic range of the first DAC device 46. As discussed above, large peaks within an input signal are relatively rare. The output of the first DAC device 46 will be selected a vast majority of the time. For example, if the threshold is set at 3.6 decibels over the average signal for one of the common telecommunication formats, the signal amplitude will fall below the threshold value around ninety percent of the time. Accordingly, for the majority of the signal, the quantization error will be very small, as the digital levels of the DAC will be closely spaced over the lessened dynamic range of the first DAC device. It will be appreciated that the switch 50 can be located in the front end of the system such that it receives the input signal from the mode control 42. In such a case, the switch 50 selects a DAC device (46 or 48) that will receive the input signal as opposed to selecting the output of one of the DAC devices.

When the amplitude of the input signal exceeds the threshold value, the mode control 42 sends a control signal to the switch 50 to select the output of the second DAC device 48. The mode control 42 can also prompt a second switch (not shown) preceding the first DAC device 46 to open to prevent the high amplitude signal from reaching the DAC device. This switching can prevent damage to the first DAC device 46 from a signal having an amplitude much larger than its intended range. As before, the input signal is delayed before reaching the DAC devices to maintain synchronization with the DAC device outputs and the switch 50. The second DAC device 48 can provide the output signal whenever the amplitude of the input signal is too large for the first DAC device 46 to convert without clipping signal peaks. A larger degree of instantaneous error will be present when the output of the second DAC device 48 is selected, but as discussed above, the output of the second DAC device will be used only a small portion of the time. Thus, its contribution to the average signal error will be minimal, and the illustrated system 40 will show a large improvement in signal noise over a system using only a single DAC device over the same dynamic range.

As discussed above, the system 40 can be implemented with more than two DAC devices and with multiple threshold amplitudes. In such a case, there can be a first DAC device covering the entire dynamic range of the system, and a plurality of other DAC devices, each having a dynamic range extending from zero to a value roughly equal to one of the threshold amplitudes. In the alternative, the signal ranges of the DAC devices may cover the total signal range of the system in a series with only slight overlap, as where the lower limit of each DAC devices dynamic range begins at a value just less than the upper limit of the preceding DAC device. Thus quantization noise will be larger only when signal power is larger. In some applications the figure of merit is instantaneous signal-to-noise ratio, so a larger quantization noise is acceptable at a high signal level. Regardless, the mode control 42 will determine an appropriate mode for the system by comparing the amplitude to a plurality of threshold values reflecting the upper limits of the output ranges of the DAC devices. Each of the plurality of DAC devices process the input signal, and the mode control 42 sends a control signal to the switch 50 to select the output of the appropriate DAC device. The use of additional DAC devices further decreases the (weighted) average noise of the system 40, but at the cost of increasing the complexity and expense of the system.

Figure 5:
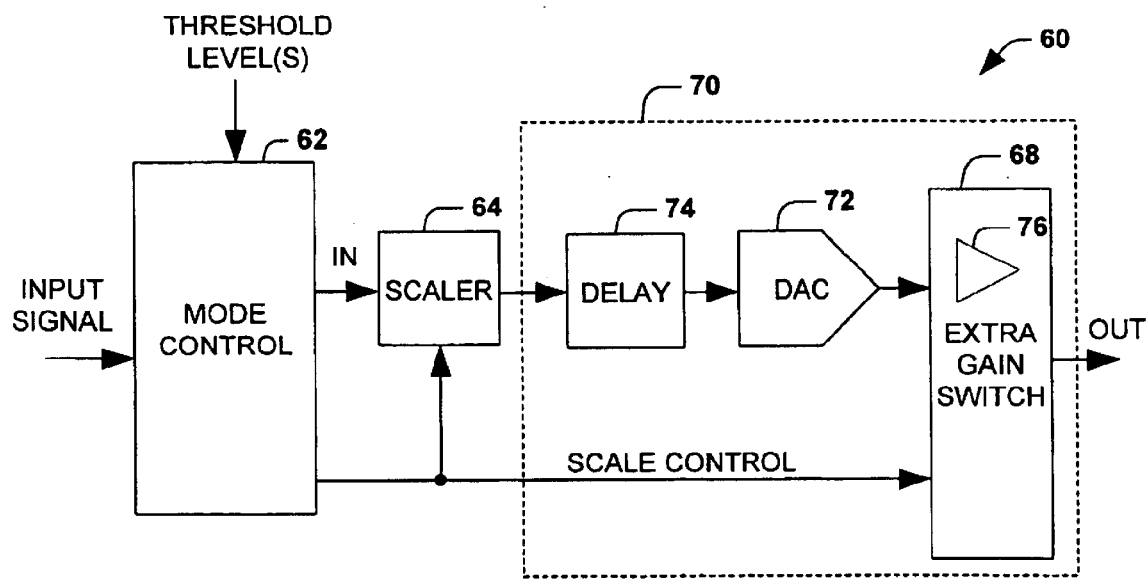
FIG. 5 illustrates a schematic block diagram of another exemplary signal conversion system in accordance with an aspect of the present invention.

In accordance with an aspect of the present invention, FIG. 5 illustrates another exemplary system 60 that converts a digital input signal into an analog output signal over an extended dynamic range employing a DAC system 70. An input signal is received by a mode control 62. The mode control 62 determines an appropriate mode for the system based on a comparison of the input signal amplitude to one or more threshold values. The mode control 62 then provides a control signal (SCALE CONTROL) to a scaler 64 and an extra gain switch 68, prompting them to select an instantaneous dynamic range for the DAC system 70. The scaler can be implemented as a digital signal processor or other digital hardware of software suitable for scaling a digital signal. If the input signal amplitude exceeds one or more of the threshold values, the scaler 64 will scale the amplitude of the signal by one of a set of at least one predetermined scaling factors associated with the highest exceeded threshold. When the input signal is provided to a DAC device 72 within the DAC system 70, the scaler 64 can scale the amplitude of the input signal to an amplitude within the output signal range of the DAC device. This scaling is reversed or inverted at the extra gain switch 68 after the digital-to-analog conversion by the DAC device 72.

Turning to the specifics of the illustrated system 60, the mode control 62 compares the amplitude of the input signal to one or more threshold values. The first threshold can be set at or just below the upper limit of the dynamic range of the DAC device 72. Other thresholds can be set at a value less than or equal to the upper limit of the dynamic range of the DAC device 72 divided by one of the scaling factors. Thus, when the signal amplitude exceeds one or more thresholds, it is known that the scaling factor associated with the largest threshold will be sufficient to reduce the signal amplitude to an acceptable range. For the purpose of example, the illustrated system 60 will be described as having a single threshold value. In such a system, there will be two modes of operation, a high range mode with an associated scaling factor, and a low range mode, which can have, but does not require, a second associated scaling factor.

If the signal value does not exceed the threshold value, the mode control 62 can instruct the scaler 64 to adopt a first scaling factor and an amplifier 76 to adopt a first gain factor. In the alternative, the input signal can be allowed to bypass the scaler 64 and/or the amplifier 76 when the signal amplitude does not exceed the threshold. For example, a mechanical switch, shown as the extra gain switch 68, can be employed to bypass the amplifier. Similarly, where the scaler 68 is implemented as a software component of a digital processor, the scaling routine may simply not be called, effectively bypassing the scaler. In the present example, a first scaling factor is provided to the scaler with a value of one. This value is chosen merely for convenience of description, and the system 60 may use any value for the first scaling factor that is useful for the intended application. Where the first scaling factor differs from one, the threshold used by the mode control 62 can be adjusted accordingly, such that the range of signal amplitudes reaching the DAC device 72 roughly matches the dynamic range of the DAC device.

The input signal is scaled at the scaler 64, although using the example scaling factor of one, the input signal passes through the scaler without a change in amplitude. The scaled signal is then delayed at a delay device 74 to synchronize the reception of the signal at the extra gain switch 68 with the implementation of the proper mode. The DAC device 72 then converts the input signal to an analog signal. The output signal is then passed to the extra gain switch 68 where can be amplified at an amplifier 76 by a first gain factor equal to the inverse of the first scaling factor. In the present example, the signal is not amplified, as the extra gain switch 68 is toggled to allow the analog signal to bypass the amplifier 76. Thus, where the input signal does not exceed the threshold, the DAC system 70 of the present example adopts a mode having an instantaneous dynamic range equal to that of DAC device 72. Where the first scaling factor is not equal to one, the instantaneous dynamic range of the DAC system 70 will vary from that of the DAC device 72 by a factor equal to the inverse of the scaling factor.

When the input signal amplitude exceeds the threshold, the mode control 62 instructs the scaler 64 to adopt a second scaling factor and the extra gain switch to adopt a second gain factor. The values of the scaling factors will be preselected according to the application and the expected maximum values of the input signal to reduce even a maximum peak signal to an amplitude within the dynamic range of the DAC device.

At the scaler 64, the amplitude of the signal will be reduced by the second scaling factor. In the present example, the scaling factor is selected such that when the second scaling factor is applied to the maximum expected amplitude of the input signal, it will be scaled to a value within the dynamic range of the DAC device 72. Where more than two scaling factors are used, one can correspond to the expected signal maximum and one or more can correspond to values falling between the upper limit of the dynamic range of the DAC device 72 and the expected signal maximum. The DAC device 72 can thereby process signals exceeding its dynamic range by a factor equal to the inverse of the smallest scaling factor, increasing the instantaneous dynamic range of the DAC system 70.

The scaled signal is delayed at the delay device 74 before it is passed to the DAC device 72. The DAC device 72 converts the scaled signal to an analog signal. The output signal from the DAC device 72 is passed to the extra gain switch 68. The extra gain switch 68 amplifies the output signal by a second gain factor equal to the inverse of the second scaling factor via the amplifier 76. This restores the signal to its original amplitude. Unfortunately, the amplification at the extra gain switch 68 produces a corresponding increase in the quantization noise of the system. As discussed above, however, high amplitude peaks within the input signal are comparatively rare. Thus, the majority of the system operation can take place using a scaling factor that does not produce a significant change in the input signal. For example, where the input signal has an amplitude falling within the dynamic range of the DAC device 72, a scaling factor that is equal to or just less than one would be appropriate. This scaling would produce little or no amplification of the quantization noise. On the comparatively rare occasions where the signal amplitude exceeds the dynamic range of the DAC device 72, it can be selectively scaled and amplified, producing instantaneous noise, but contributing very little to the average noise of the signal. The system of FIG. 5 only uses a single DAC device but requires additional small signal amplification and switching hardware compared to the system of FIG. 4.

Figure 6:
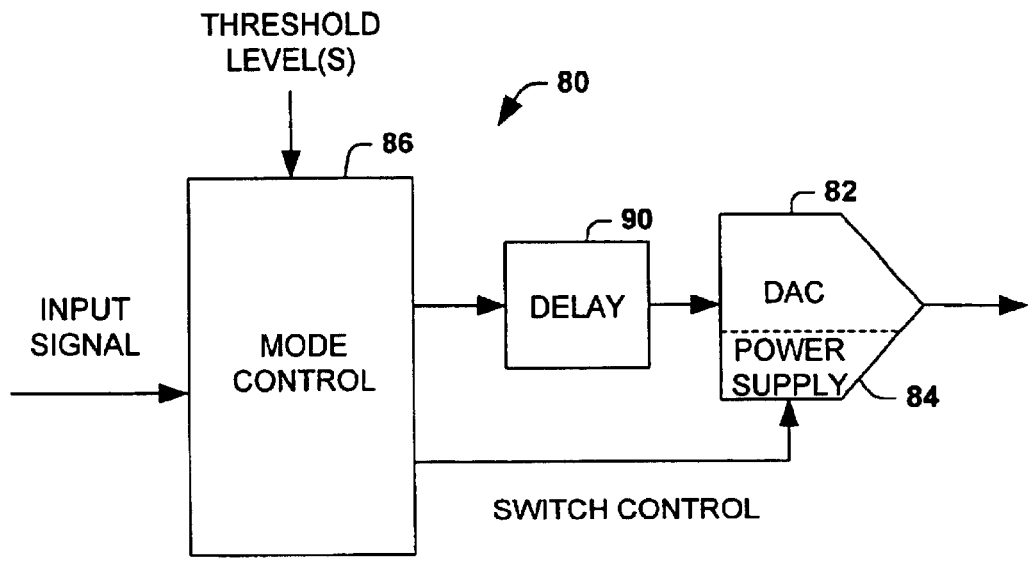
FIG. 6 illustrates a schematic block diagram of yet another exemplary signal conversion system in accordance with an aspect of the present invention.

In accordance with an aspect of the present invention, FIG. 6 illustrates yet another exemplary system 80 that converts a digital input signal into an analog output signal over an extended dynamic range. The system includes a DAC device 82 having a variable output signal range that may be set using a power supply level 84 set to one of a plurality of predetermined ranges. An input signal is received by a mode control 86. The mode control 86 compares the amplitude of the signal to one or more threshold values and outputs a control signal to the voltage supply input 84 of the DAC device 82, instructing it to select a new output signal range. Where the system contains multiple thresholds, each threshold has an associated dynamic range that is selected when the threshold is the smallest threshold not surpassed by the input signal amplitude. In the present example, the associated dynamic range of each threshold will have an upper limit just greater than the threshold amplitude.

The input signal is delayed at a delay device 90 to synchronize the reception of the input signal at the DAC device 82 with the selection of the dynamic range. The input signal is then passed to the DAC device 82, where it is converted into an analog signal. By selecting the dynamic range according to the input signal, it is possible for the system 80 to always use the range giving the best resolution for a particular signal, reducing the average quantization noise of the signal. As discussed under the earlier embodiments, for a signal having a high peak-to-average signal ratio, even the use of two separate dynamic ranges can significantly decrease the average quantization noise, as the higher dynamic range will be needed rarely in comparison to the lower dynamic range.

Figure 7:
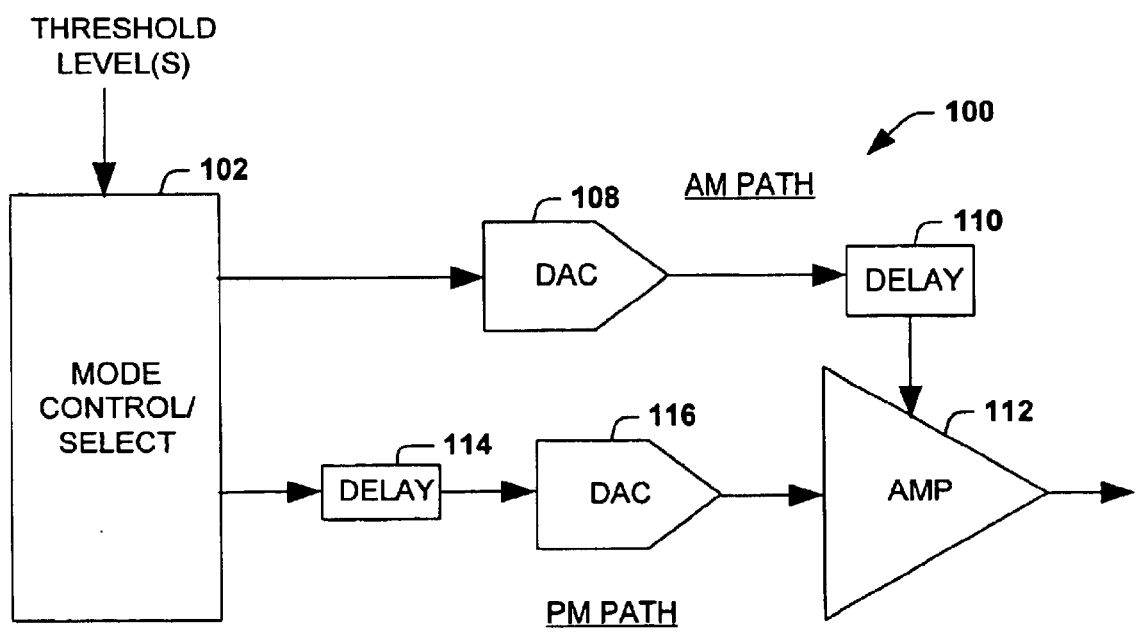
FIG. 7 illustrates a schematic block diagram of still another exemplary signal conversion system in accordance with an aspect of the present invention.

In accordance with an aspect of the present invention, FIG. 7 illustrates still another system 100 that converts a digital input signal into an analog output signal over an extended dynamic range. In this example, a mode control and a mode selector are combined into a single mode control/select module 102. This mode control/select module 102 may be implemented as a digital signal processor or any appropriate combination of digital hardware or software. This mode control/select module 102 is responsible both for evaluating the input signal and for adjusting the instantaneous dynamic range of the DAC system. The mode control/select module 102 receives an input signal and evaluates the signal to determine an appropriate mode for the DAC system. The mode control/select module 102 receives a composite signal component that is a polar representation of an input signal. The input signal is a phase and amplitude modulated signal which can be represented in polar form by the following equation:

$$A(t)B*\cos(\omega_c(t)+\phi(t))$$

where A(t) is the amplitude modulated component and $B*\cos(\omega_c(t)+\phi(t))$ is the phase modulated component, B is a scalar, $\phi(t)$ is the phase component and $\omega_c(t)$ is the carrier frequency. The input signal can be in a variety of different amplitude and/or phase modulated forms. It is to be appreciated that EQ. 1 illustrates a polar representation of a single carrier input signal, where the actual signal can be a multi-carrier signal.

For example, the signal can be a signal that conforms to WCDMA, multi-carrier GSM, OFDM or other signals having signatures with high peak-to-average (PAR) ratios. The input signal can be transformed by the mode control/select module 102 into a polar composite signal. Alternatively, the input signal can be provided in polar form directly to the mode control/select module 102. The mode control/select module 102 receives a threshold level that can be one or more fixed, selectable or programmable characteristics (e.g., envelope amplitude level) associated with the input signal. In the illustrated example, the threshold level corresponds to a threshold amplitude of the input signal.

When the amplitude of the input signal exceeds the threshold level, the mode control/select module 102 will split the input signal into a phase modulated component, having a constant signal envelope, and an amplitude modulated component. The amplitude modulated component is passed to a first DAC device 108. Generally, the first DAC device 108 can have a comparatively low resolution without significantly hindering the performance of the system 100, but the necessary resolution for the first DAC device 108 will vary with the application. The first DAC device 108 transforms the amplitude modulated component into an analog signal having one of a plurality of amplitude values. The number of values available for the amplitude modulated signal will vary with the resolution of the first DAC device 108. For example, a six bit DAC device will produce sixty-four discrete values. The analog amplitude modulated signal will be input to a delay device 110 for synchronization purposes. The signal is then received at an amplifier 112 as a supply input.

The phase modulated component is first sent to a delay device 114 for synchronization purposes. The phase modulated component is then inputted into a second DAC device 116. In the present example, the second DAC device 116 has a resolution greater than that of the first DAC device 108, but the relative resolutions can vary with the application. The second DAC device 116 processes only the phase modulated component of the signal, which has a substantially constant signal envelope. Accordingly, the dynamic range of the second DAC device 116 can be significantly less that of a single DAC converting the composite signal.

Where the input signal amplitude does not exceed the threshold amplitude, the mode control/select module 102 directs the input signal to the second DAC device 116 through the delay device 114. A constant level supply signal is sent to the amplifier 112 through the first DAC device 108. The input signal is then converted at the second DAC device 116 and the output is passed through the amplifier 112 at the constant voltage supply. In the example embodiment, the constant supply level provides a gain factor of one, indicating that the output signal is not amplified. In the alternative, however, the input signal may be scaled prior to its input to the second DAC device. 116, and the constant voltage supply could represent a gain factor necessary to reverse the scaling. The amplifier can also be used to scale up the input signal in preparation for transmitting the signal.

In the illustrated example, the threshold value used by the mode control/select module 102 is derived from the dynamic range of the second DAC device 116 and is determined such that the second DAC device 116 processes the majority of the signals. Alternatively, the threshold value may be set at zero, such that all signals are processed as their amplitude and phase modulated components. The impact of reducing the resolution of the first DAC device 108 and/or the second DAC device 116 is an increase in quantization noise both adjacent to the wanted signal and in nearby spectral channels. The latter may dominate the resolution requirement. A filter, especially one whose passband can be selected to match the wanted signal, that removes the signals in nearby and/or adjacent spectral bands can significantly reduce the number of bits needed.

FIG. 8 is an example of a portion of a transmitter 120 that can be implemented using an extended range DAC system in accordance with an aspect of the present invention. In the illustrated example, direct-to-RF digital-to-analog conversion is facilitated by employing a delta-sigma modulator in conjunction with an extended range DAC system. A digital input signal is provided from a CPU 122 to an input of an extended range DAC system 124. The DAC system incorporates a delta-sigma modulator for increasing the carrier frequency of the digital input signal. The delta-sigma modulator provides a quantized output signal within the DAC system 124. This quantized output may be provided at a coarser resolution and a higher sample rate as compared to the digital input signal.

In this example, the DAC system 124 converts the quantized signal directly to an analog signal at a desired transmission frequency (e.g., UHF or microwave frequencies). By way of particular example, for GSM, the desired transmission frequency can be a spectrum (e.g., about 10 MHz) having a center frequency at about 940 MHz. It will be understood and appreciated that other transmission frequencies (e.g., in the MHz range or higher) can be efficiently and cost effectively provided in accordance with an aspect of the present invention.

The analog signal is then filtered, such as with an analog bandpass filter 126, to remove out-of-band emissions and quantization noise. The filtered output is then provided to a power amplifier 128 that amplifies the signal to a desired level. The power amplifier 128 then feeds one or more antennas 130 that propagate the amplified signal through air or some other wireless medium (e.g., space).

FIG. 9 is another example of a portion of a transmit module 140 that can be implemented utilizing an extended range DAC system in accordance with an aspect of the present invention. The front end of the module 140 is similar to that shown and described with respect to FIG. 8. Briefly stated, a digital input signal is provided from a CPU 142 to an extended range DAC system 144. The DAC system 144 converts the signal to an analog output signal at a predetermined frequency. The predetermined frequency will vary according to the application and the specific construction of the DAC system 144, but will generally be frequency lower than a desired transmission frequency.

The analog signal is provided to an upmixing system 146. The upmixing system 146 can include one or more stages of upconversion and mixing, as needed to upmix the signal to a desired carrier frequency. The upmixing system 146 can include at least one local oscillator 148 and at least one mixer 150 that produce a signal having a desired transmission frequency. In the illustrated example, only one of each structure is shown with a single stage of mixing, but multiple stages of mixing may be necessary depending on the original frequency of the analog signal. In the illustrated example, the local oscillator 148 is utilized to provide a desired carrier frequency at a desired transmission frequency. The mixer 150 produces an RF signal by combining the analog output signal with a carrier signals provided by the local oscillator 148.

A filter 152, in turn, optimizes the bandwidth and mitigates unwanted out-of-band emissions and quantization error, such as may result from the digital-to-analog conversion process as well as the upmixing. The filter 152 provides the filtered analog output signal to an associated power amplifier 154. The power amplifier 154, in turn, provides an amplified signal to an associated antenna 156 for wireless transmission. Those skilled in the art will understand and appreciate various other types of filtering and up-conversion that can be utilized to provide a desired RF signal utilizing the extended range DAC system in accordance with an aspect of the present invention.

Figure 10:
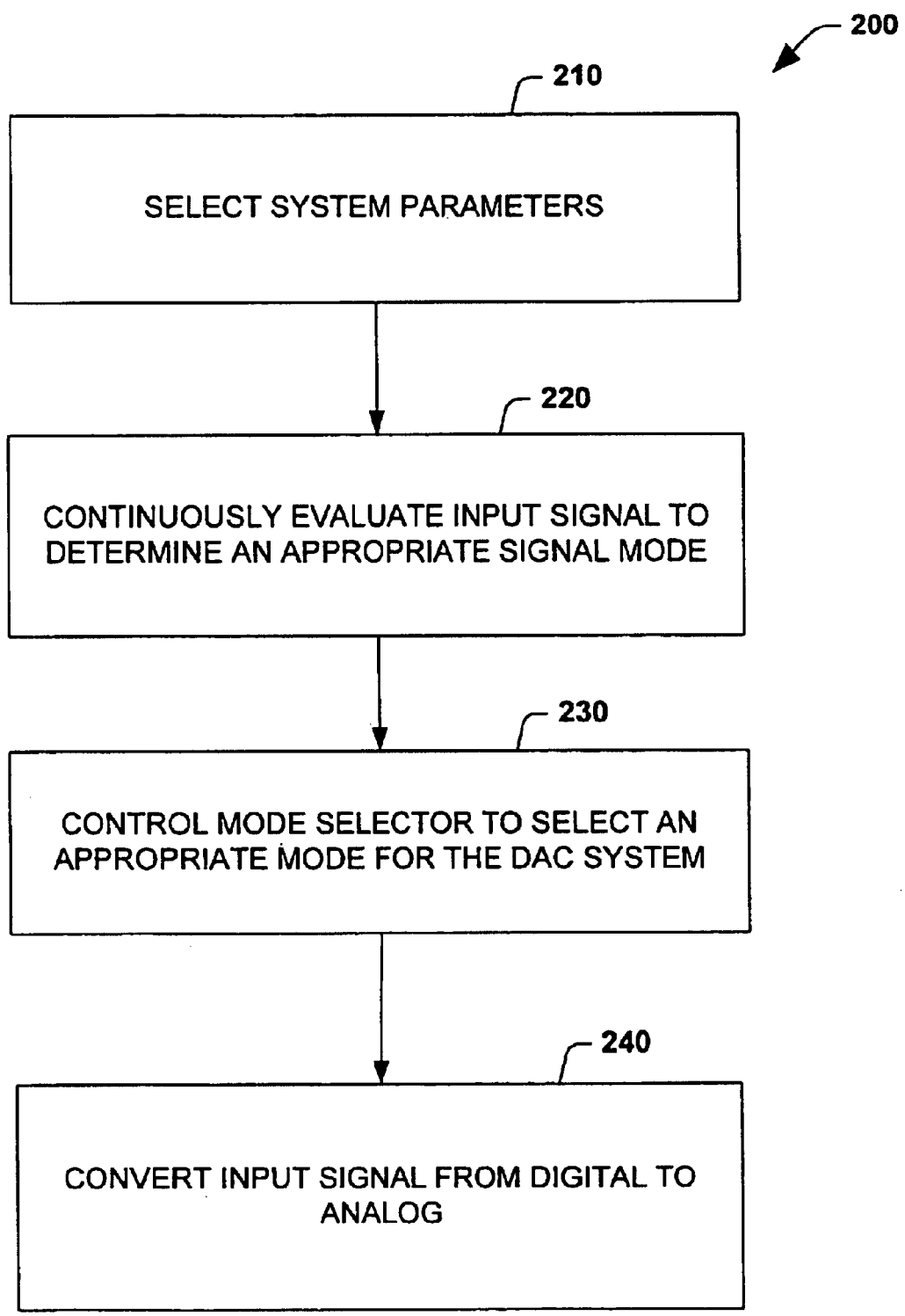
FIG. 10 illustrates a methodology for converting an input signal from a digital signal to an analog signal over an extended dynamic range in accordance with an aspect of the present invention.

FIG. 10 is a flow diagram illustrating a methodology 200 for converting an input signal from a digital signal to an analog signal over an extended dynamic range in accordance with an aspect of the present invention. The process begins at 210, where the system is initialized. During initialization, one or more threshold levels, scaling factors, DAC dynamic ranges, and other parameters are selected for the application. These parameters can be selected by an operator or by one or more automated processes. At 220, a mode control evaluates a characteristic of an input signal to determine an appropriate mode for a DAC system from a plurality of modes. Each of the plurality of modes has an associated effective output signal range and quantization noise level. Any readily quantifiable characteristic of the input signal, may be used in this evaluation. The specifics of the evaluation will vary with the application. Examples of the evaluation of an amplitude characteristic are described above in reference to FIGS. 4–7. One skilled in the art will appreciate, in light of the teachings of the present invention, that other methods of evaluating the signal amplitude exist, and that different methods of evaluation may be useful when evaluating different signal characteristics, such as the phase or frequency of the signal. Each of these methods is encompassed within the present invention and the appended claims.

At 230, the mode control sends a control signal to a mode selector within the DAC system to prompt the mode selector to select the appropriate mode. The composition of the mode selector will vary with the application, but it can include hardware or software representations of one or more switches, amplifiers, scaling devices, or any other component necessary to select a mode with the DAC system. The selection can take place by any number of means, but the selection is operative to change the instantaneous dynamic range of the DAC system. Examples of the selection process include from simply changing the dynamic range of a DAC, selecting between two or more DAC's having different ranges, or altering the input signal as to allow a DAC to exceed its dynamic range. One skilled in the art will appreciate that other methods of changing the instantaneous dynamic range of a DAC system exist, and these method are encompassed within the present invention and the appended claims.

At 240, the DAC system converts the input signal from a digital signal to an analog signal using the selected mode. The DAC system, which comprises the mode selector as well as an arrangement of one or more DACs, will be configured by the mode selector to operate at the selected instantaneous dynamic range. The instantaneous dynamic range will change with the characteristic of the input signal. It can therefore be expected that the instantaneous noise of the signal will change accordingly. Accordingly, the analog output signal will have a variable amount of noise at any one point, but the ensemble dynamic range will be greater than any single mode and the average noise of the signal will be reduced by matching an appropriate dynamic range to the input signal.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A conversion system that converts an input signal from a digital signal to an analog signal, the system comprising:
   a plurality of digital-to-analog converter (DAC) devices, each of the plurality of DAC devices having a different associated output amplitude range;
   a mode selector that selects an associated output of one of the plurality of DAC devices based on a characteristic of the input signal; and
   a mode control that evaluates the characteristic of the input signal relative to at least one threshold level to determine the mode selected by the mode selector.

2. The system of claim 1, the characteristic of the input signal being one of the amplitude, frequency and phase of the input signal.

3. The system of claim 1, the mode selector selecting the output of one of the plurality of DAC devices by changing the configuration of an analog switch.

4. The system of claim 1, the system further comprising a delta-sigma modulator associated with at least one of the plurality of DAC devices.

5. A transmitter comprising the conversion system of claim 1.

6. A digital-to-analog conversion system comprising:
   means for converting an input signal from a digital signal to an analog signal;
   means for scaling the input signal by a scale factor to provide a scaled version of the input signal within a dynamic range of the means for converting;
   means for amplifying the converted input signal by a gain factor that is an inverse of the scale factor; and
   means for controlling the operation of the means for converting among a plurality of modes based on a characteristic of the input signal, each mode having an associated instantaneous dynamic range, and at least one of the plurality of modes utilizing the means for scaling and the means for amplifying.

7. The system of claim 6, the means for controlling comprising means for comparing the amplitude of the input signal to at least one threshold value.

8. The system of claim 6, further comprising means for converting at least a portion of the input signal from the digital domain to the analog domain directly to a desired radio transmission frequency.

9. The system of claim 6, further comprising means for providing an amplitude modulated component and a phase modulated component of the input signal to the means for converting in a first mode and the input signal to the means for converting in a second mode.

10. A conversion system that converts an input signal from a digital signal to an analog signal, the system comprising:
    a digital-to-analog converter (DAC) system;
    a mode selector that selects a mode of operation for the DAC system from a plurality of modes based on a characteristic of the input signal, each mode having an associated instantaneous dynamic range;
    a scaler that scales the input signal by an appropriate scaling factor in at least one of the plurality of modes to provide a scaled version of the input signal within a dynamic range of a DAC device, the scaled version of the input signal being converted to an analog signal by the DAC device; and an amplifier that amplifies the analog signal by a gain factor substantially equal to an inverse of the scale factor.

11. The system of claim 10, further comprising a mode control that evaluates an amplitude level of the input signal and selects between one of scaling the input signal and not scaling the input signal based on the evaluation.

12. The system of claim 10, the characteristic of the input signal being one of the amplitude, frequency and phase of the input signal.

13. The system of claim 10, further comprising a mode control that evaluates the characteristic of the input signal relative to at least one threshold level to determine the mode selected by the mode selector.

14. The system of claim 10, the digital-to-analog converter system comprising a delta-sigma modulator DAC system.

15. A transmitter comprising the conversion system of claim 10.

16. A conversion system that converts an input signal from a digital signal to an analog signal, the system comprising:

a first digital-to-analog converter (DAC) device;

a second DAC device;

an amplifier having an input terminal and a voltage supply terminal; and a mode selector that selects a mode of operation for the DAC system from a plurality of modes based on a characteristic of the input signal, each mode having an associated instantaneous dynamic range, and transmits a phase modulated signal component of the input signal to the input terminal through the first DAC device and an amplitude modulated signal component of the input signal through the second DAC device to the voltage supply terminal.

17. The system of claim 16, the mode selector selects between first and second modes of operation based on the characteristic of the input signal, the mode selector transmits a phase modulated signal component to the input terminal and an amplitude modulated signal component of the input signal to the supply terminal during the first mode of operation, and the mode selector transmitting a composite signal component to the input terminal and a substantially constant amplitude signal component to the voltage supply terminal during the second mode of operation.

18. The system of claim 16, the characteristic of the input signal being one of the amplitude, frequency and phase of the input signal.

19. The system of claim 16, further comprising a mode control that evaluates the characteristic of the input signal relative to at least one threshold level to determine the mode selected by the mode selector.

20. The system of claim 16, the system further comprising a delta-sigma modulator associated with at least one of the first DAC and the second DAC.

21. A transmitter comprising the conversion system of claim 16.

* * * * *